(12) United States Patent
Dorai

(10) Patent No.: US 7,667,208 B2
(45) Date of Patent: Feb. 23, 2010

(54) TECHNIQUE FOR CONFINING SECONDARY ELECTRONS IN PLASMA-BASED ION IMPLANTATION

(75) Inventor: Rajesh Dorai, Danvers, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 206 days.

(21) Appl. No.: 11/550,140

(22) Filed: Oct. 17, 2006

(65) Prior Publication Data

US 2008/0087839 A1    Apr. 17, 2008

(51) Int. Cl.
*H01J 37/244* (2006.01)
*H01J 37/252* (2006.01)

(52) U.S. Cl. .......................... 250/396 ML; 250/396 R; 250/399; 250/400

(58) Field of Classification Search .......... 250/396 ML, 250/396 R, 399, 400
See application file for complete search history.

(56) References Cited

U.S. PATENT DOCUMENTS

| | | | | |
|---|---|---|---|---|
| 5,072,125 A | * | 12/1991 | Nakanishi et al. | 250/492.2 |
| 5,587,587 A | * | 12/1996 | Hashimoto | 250/492.21 |
| 6,375,810 B2 | * | 4/2002 | Hong | 204/192.12 |
| 7,132,672 B2 | * | 11/2006 | Walther et al. | 250/492.3 |
| 7,253,417 B2 | * | 8/2007 | Frosien et al. | 250/396 R |
| 7,409,043 B2 | * | 8/2008 | Dunham et al. | 378/115 |
| 7,459,681 B2 | * | 12/2008 | Arai et al. | 250/306 |
| 7,507,978 B2 | * | 3/2009 | Vanderberg et al. | 250/492.21 |
| 2006/0236931 A1 | * | 10/2006 | Singh et al. | 118/723 E |

* cited by examiner

*Primary Examiner*—David A Vanore

(57) ABSTRACT

A technique for confining secondary electrons on a wafer is disclosed. In one particular exemplary embodiment, the technique may be realized as an apparatus and method for confining secondary electrons in plasma-based ion implantation. The apparatus and method may comprise a magnetic field portion of a magnetic field configuration placed under a target wafer for generating a magnetic field above the target wafer for confining secondary electrons on the target wafer. The apparatus and method may also comprise a magnetic field above the target wafer that is substantially parallel to an upper surface of the target wafer. The apparatus and method may additionally comprise a magnetic field portion comprising at least one of a plurality of coils, one or more current-carrying wires, and a plurality of magnets.

18 Claims, 6 Drawing Sheets

TECHNIQUE FOR CONFINING SECONDARY ELECTRONS IN PLASMA-BASED ION IMPLANTATION

FIELD OF THE DISCLOSURE

The present disclosure relates generally to plasma-based ion implantation and, more particularly, to a technique for confining secondary electrons in plasma-based ion implantation.

BACKGROUND OF THE DISCLOSURE

Ion implantation is a process of depositing chemical species into a substrate by direct bombardment of the substrate with energized ions. In semiconductor fabrication, ion implanters are used primarily for doping processes that alter the type and level of conductivity of target materials. A precise doping profile in an integrated circuit (IC) substrate and its thin-film structure is often crucial for proper IC performance. To achieve a desired doping profile, one or more ion species may be implanted in different doses and at different energy levels. A specification of the ion species, doses, and energies is referred to as an ion implantation recipe.

In conventional ion implantation, ions are extracted from a plasma source and are typically filtered (e.g., for mass, charge, energy), accelerated and/or decelerated, and collimated through several electro-static/dynamic lenses before being directed to a substrate. By contrast, in plasma-based ion implantation, a substrate is immersed in plasma. A negative voltage is applied to the substrate and ions are extracted through a subsequent sheath between the substrate and plasma.

Several types of plasma sources exist, such as capacitively-coupled plasmas (CCPs), inductively-coupled plasmas (ICPs), glow discharges (GD), and hollow cathode (HC), to name a few. Of these examples, ICPs are typically better suited for conditions of interest in ion implantation because of lower electron temperature and higher electron density when compared to CCPs. An example of an ICP is radio frequency (RF) plasma.

A cross-sectional view of a typical radio frequency plasma doping system (RF-PLAD) 100 is depicted in FIG. 1. The plasma doping system 100 includes a plasma chamber 102 and a chamber top 104. The chamber top 104 includes a conductive top section 116, a first section 106, and second section 108. The top section 116 has a gas entry 118 for a process gas to enter. Once the process gas enters the gas entry 118 of the top section 116, it flows on top of a baffle 126 before being evenly distributed in the chamber 102. The first section 106 of the chamber top 104 extends generally in a horizontal direction. The second section 108 of the chamber top 104 extends from the first section 106 in generally a vertical direction. A planar coil antenna 112 having a plurality of turns wraps around the second section 108. A helical coil antenna 114 having a plurality of turns typically sits on the first section 106 and surrounds the second section 108. The first and second sections 106, 108 are typically formed of a dielectric material 110 for transferring RF power to the plasma inside the chamber 102.

An RF source 130, e.g., an RF power supply, may be electrically connected to at least one of the planar coil antenna 112 and the helical coil antenna 114 by an impedance matching network 132 that maximizes power transferred from the RF source 130 to the RF antennas 112, 114. When the RF source 130 resonates RF currents in the RF antennas 112, 114, the RF antennas 112, 114 induce RF currents into the chamber 102 to excite and ionize process gas for generating a plasma in the chamber 102.

The geometry of the first and second sections 106, 108 of the chamber top 104 and the configuration of the RF antennas 112, 114 are chosen so that a uniform plasma is generated. In addition, electromagnetic coupling may be adjusted with a coil adjuster 134 to improve uniformity of generated plasma.

A platen 124 is positioned in the chamber 102 below the baffle 126. The baffle 126 may be grounded or floating. A target wafer 120 is positioned on a surface of the platen 124, which may be biased by a voltage power supply 128, so that ions in generated plasma are attracted to the target wafer 120.

Referring to FIG. 2, a conventional substrate or target wafer 120 is shown. Upon energetic ion bombardment on the wafer 120, secondary electrons are typically produced. For example, a 10 keV $BF_2^+$ ion produces approximately 6 secondary electrons upon impact with a silicon (Si) wafer. Thus, for every positive ion implanted, a +7 charge results on the wafer 120. At low pressures (e.g., a few mTorr), most of these electrons are transparent to bulk gas or plasma and may end up colliding with the baffle 126 to cause sputtering or heating up. At higher pressures (e.g., several tens of mTorr), an appreciable fraction of these secondary electrons may collide with bulk gas resulting in ionization and/or dissociation. Consequently, bulk density distribution and implant dose are greatly affected by unconfined secondary electrons.

In view of the foregoing, it would be desirable to provide a technique for confining on a wafer secondary electrons in plasma-based ion implantation to overcome the above-described inadequacies and shortcomings.

SUMMARY OF THE DISCLOSURE

A technique for confining secondary electrons is disclosed. In accordance with one particular exemplary embodiment, the technique may be realized as an apparatus for confining secondary electrons in plasma-based ion implantation. The apparatus may comprise a magnetic field portion of a magnetic field configuration placed under a target wafer for generating a magnetic field above the target wafer for confining secondary electrons on the target wafer.

In accordance with other aspects of this particular exemplary embodiment, the magnetic field above the target wafer is substantially parallel to an upper surface of the target wafer.

In accordance with further aspects of this particular exemplary embodiment, the magnetic field portion comprises a plurality of coils.

In accordance with additional aspects of this particular exemplary embodiment, the magnetic field portion comprises one or more current-carrying wires.

In accordance with further aspects of this particular exemplary embodiment, the magnetic field portion comprises a plurality of magnets.

In accordance with another exemplary embodiment, the technique may be realized as a method for confining secondary electrons in plasma-based ion implantation.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Figure 1:
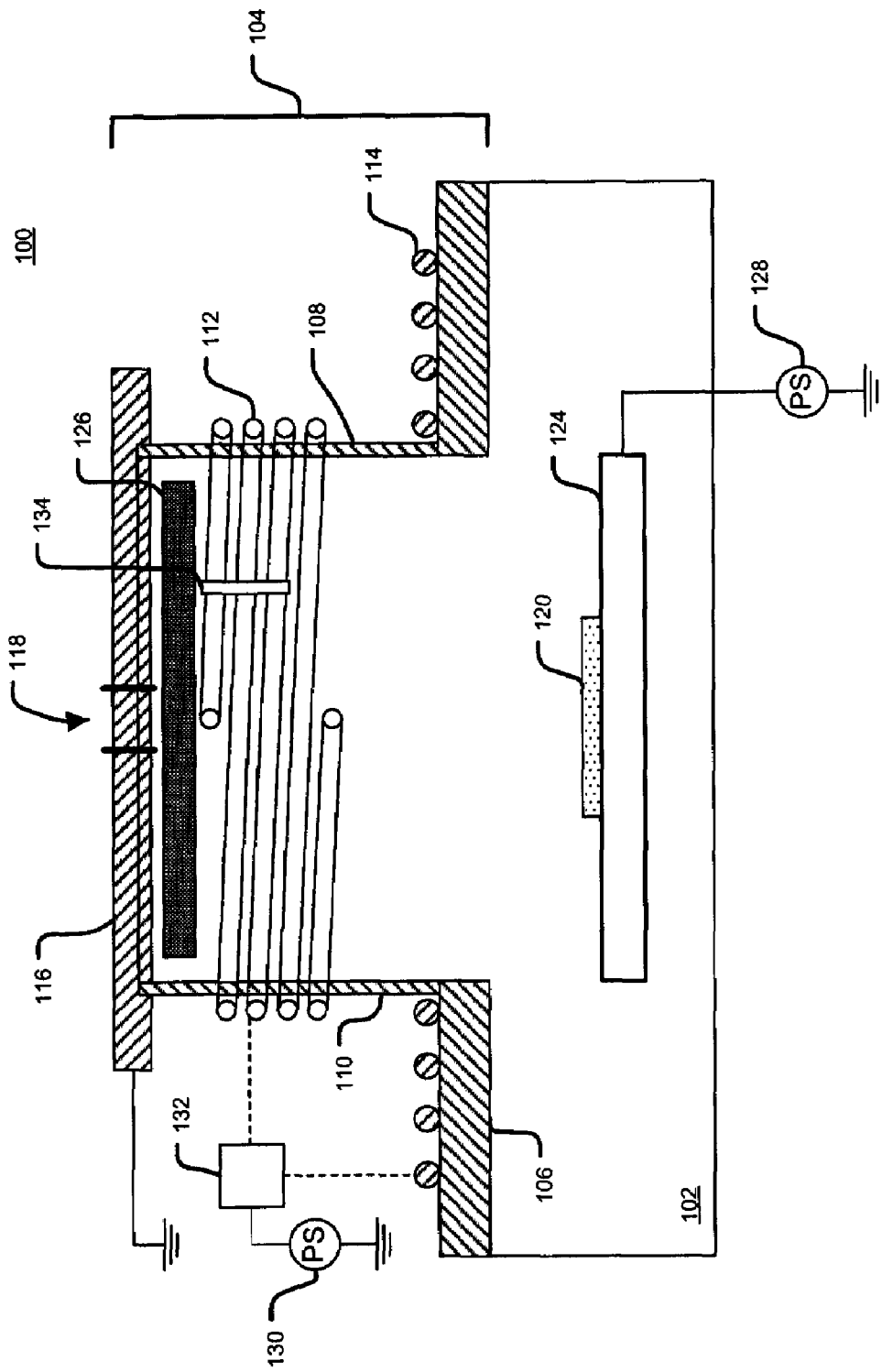
FIG. 1 depicts a conventional RF-PLAD ion implantation system.
Figure 2:
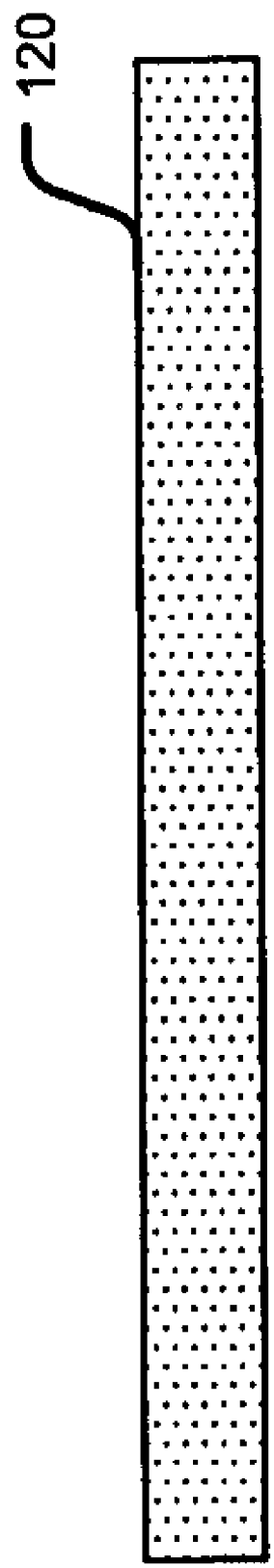
FIG. 2 depicts a conventional substrate for the conventional RF-PLAD ion implantation system of FIG. 1.
Figure 3B:
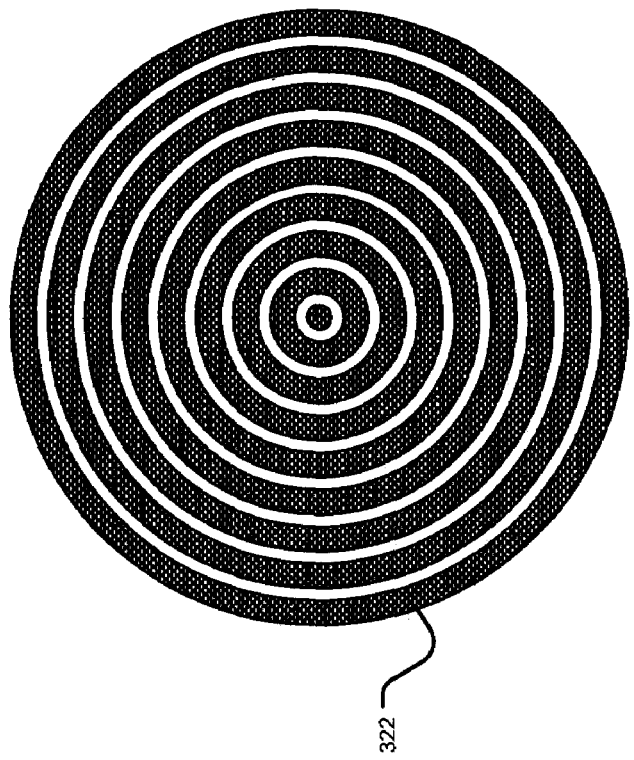
FIGS. 3A and 3B depict a magnetic field configuration according to an embodiment of the present disclosure.
Figure 3A:
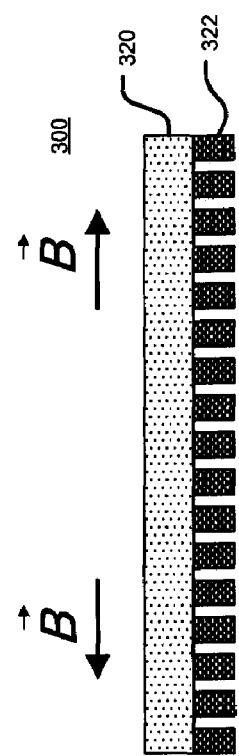

Referring to FIG. 3A, a side view of a magnetic field configuration 300 is shown in accordance with an embodiment of the present disclosure. The magnetic field configuration 300 may include a magnetic field portion 322 under a target wafer 320.

FIG. 3B depicts a top view of the magnetic field portion 322 of the magnetic field configuration 300. In this embodiment, the magnetic field portion 322 may be formed of a plurality of coils in a configuration of two or more concentric circles such that the coils do not extend beyond the wafer 320. In another embodiment, the plurality of coils may be formed in a spiral configuration. The magnetic field portion 322 may generate a magnetic field B above the wafer 320 that is substantially parallel to an upper surface of the wafer 320 and extends radially outward to sides of the wafer 320.

Generating a magnetic field B that is substantially parallel to the upper surface of the wafer 320 may prevent changes to bulk plasma properties that usually result when secondary electrons interact with background gas. Confining the secondary electrons may also help avoid sputtering and/or heating up of an anode, which usually collects unconfined secondary electrons. Moreover, restoring secondary electrons back to the wafer 320 may significantly reduce charge buildup on the wafer 320 at higher implant energies.

One advantage of utilizing the magnetic field portion 322 as shown in FIGS. 3A and 3B, which may be an electromagnetic coil assembly, may include the ability to switch on and off the magnetic field B during on and off periods of a DC bias. This may provide more control and flexibility for dose and implant energies in RF-PLAD.

Figure 4B:
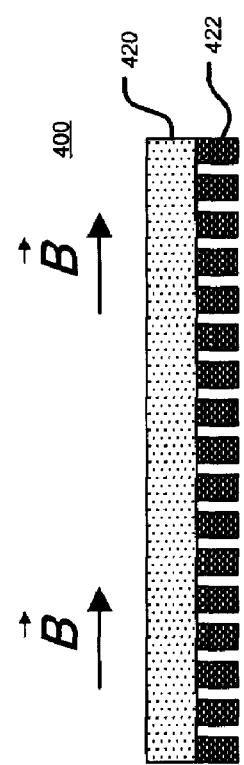
FIGS. 4A and 4B depict a magnetic field configuration according to an embodiment of the present disclosure.
Figure 4A:
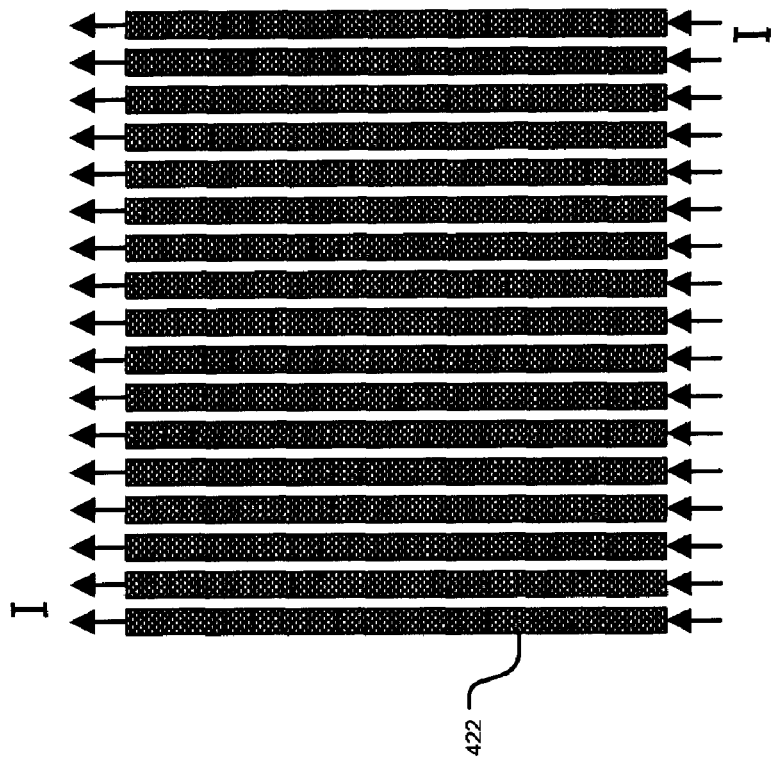

Referring to FIG. 4A, a side view of another magnetic field configuration 400 is shown in accordance with an embodiment of the present disclosure. In this embodiment, the magnetic field configuration 400 may include a magnetic field portion 422 under a target wafer 420. Instead of generating a magnetic field B that extends radially outward to edges of the wafer 420 (i.e., as shown in FIG. 3A), the magnetic field portion 422 may generate magnetic field B that points in one direction, e.g., towards one side of the wafer 420. When the magnetic field B is above and substantially parallel to an upper surface of the wafer 420, changes to bulk plasma properties may be prevented when secondary electrons from the wafer 420, which may otherwise interact with the background gas, are confined.

To generate the magnetic field B that points in one direction, a plurality of current-carrying wires may be positioned in the configuration 400 depicted in FIG. 4B. In this embodiment, the magnetic field portion 422 may include a plurality of parallel wires that are independent and detached from each other. A current I may run through each of the wires from one end to the other in a predetermined direction. When the current I runs in one direction, the magnetic field B also runs in one direction, e.g., substantially parallel to the upper surface of the wafer 420 and orthogonal to the current I. Other various configurations and arrangements may also be considered.

Figure 5B:
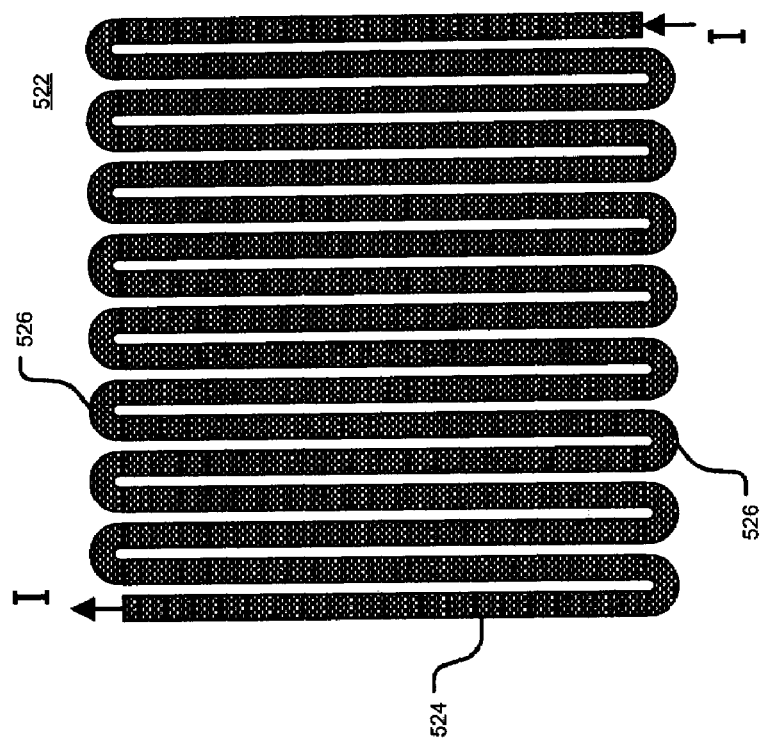
FIGS. 5A and 5B depict a magnetic field configuration according to an embodiment of the present disclosure.
Figure 5A:
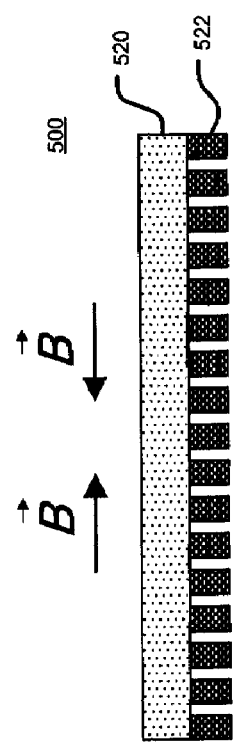

Referring to FIGS. 5A and 5B, another embodiment of the present disclosure is shown. FIG. 5A depicts a side view of a magnetic field configuration 500 that may include a magnetic field portion 522 under a target wafer 520. In this embodiment, the magnetic field portion 522 may generate a magnetic field B that remains above and substantially parallel to an upper surface of the wafer 520, but the magnetic field B may be pointing in different and/or opposite directions.

FIG. 5B depicts a top view of the magnetic field portion 522. In this embodiment, the magnetic field portion 522 may include one current-carrying wire having a plurality of parallel portions 524 and a plurality of connecting portions 526. A current I may run in one direction along the wire. However, because the wire winds back and forth, each adjacent parallel portion 524 of the wire effectively has a current that runs in opposite directions. Consequently, the magnetic field B above the upper surface of the wafer 520 points, alternatingly, in opposite directions since each parallel portion 524 generates a magnetic field corresponding to the current I in the each parallel portion 524.

Although each of the coils and/or current-carrying wires is shown with a rectangular cross section in the illustrated embodiments of the present disclosure, other shapes (e.g., circular, etc.) and sizes may also be considered. The coils and/or current-carrying wires may also be fabricated of an electromagnetic material, e.g., iron, aluminum, etc. Other materials, such as ferroelectric and/or conductive materials, etc., may also be considered in accordance with the present disclosure.

Figure 6:
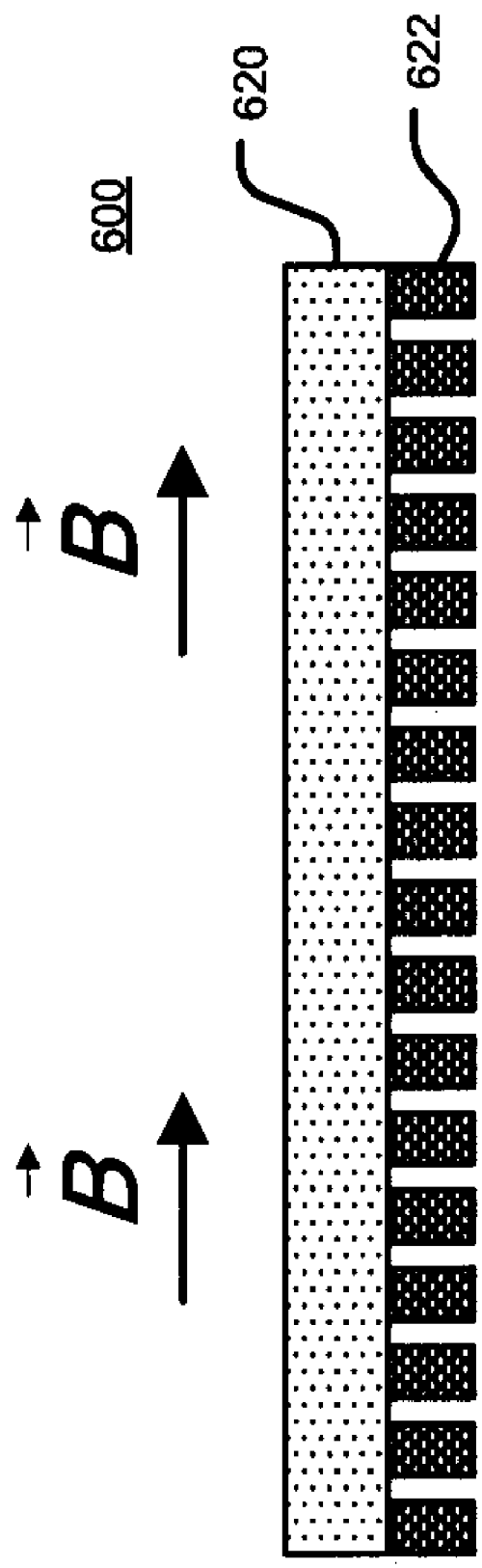
FIG. 6 depicts a magnetic field configuration according to an embodiment of the present disclosure.

Referring to FIG. 6, another embodiment of the present disclosure is shown. In this embodiment, a magnetic field configuration 600 may include a magnetic field portion 622 under a target wafer 620. Instead of coils or current-carrying wires, the magnetic field portion 622 may include a plurality of magnets. In one embodiment of the present disclosure, the magnets may be permanently placed below the wafer 620. A resulting magnetic field B above an upper surface of the wafer 620 may point in one predetermined direction depending on how the plurality of magnets are arranged. In another embodiment, the plurality of magnets may be positioned in a configuration so that the magnetic field B above the upper surface of the wafer 620 does not substantially affect bulk plasma, which is typically above and around the wafer 620. In yet another embodiment, the magnets may be moveable and/or positioned at a distance below the wafer 620 so as to allow for dynamic variation in strength and direction of a magnetic flux density at least at or above the surface of the wafer 620. Other various configurations and materials may also be provided, as long as the magnetic field B generated above the wafer 620 is substantially parallel to the upper surface of the wafer 620 or otherwise provides an effective confinement of the secondary electrons.

It should be appreciated that while embodiments of the present disclosure are directed to confining secondary electrons in RF-PLAD, other implementations may be provided as well. For example, a technique for confining of secondary electrons may apply to plasma-based ion implantation systems, such as glow discharge plasma doping (GD-PLAD) system. In this example, an additional source of plasma, such as a hollow cathode, may also be provided.

In addition to improving independent control of dose and implant energy, a technique for confining secondary electrons in plasma-based ion implantation may have further advantages. Greater accuracy in the measurement of dose on wafer may be achieved by measuring current through the wafer. A magnetic field to confine secondary electrons also alleviate other charging issues, e.g., by reducing the charging up of wafers during implantation. Increased uniformity of implantation may be also be another advantage achieved as a consequence of improved control of bulk plasma density.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure can be beneficially implemented in any number of environments for any number of purposes. Accordingly, the claims set forth below should be construed in view of the full breadth and spirit of the present disclosure as described herein.

The invention claimed is:

1. An apparatus for confining secondary electrons, the apparatus comprising:
    a plasma chamber and a plasma source configured to generate plasma in the plasma chamber;
    a magnetic field portion of a magnetic field configuration placed under a target wafer for generating a magnetic field above the target wafer for confining secondary electrons on the target wafer, wherein the target wafer and the magnetic field portion are disposed in the plasma chamber, and wherein the magnetic field portion is moveable to allow for dynamic variation in the magnetic field, and wherein the magnetic field portion comprises one or more current-carrying wires, and wherein the apparatus further comprises a DC bias source to bias the target wafer with a DC bias signal having on and off periods, wherein the magnetic field is switched on during the on period of the DC bias signal and off during the off period of the DC bias signal.

2. The apparatus of claim 1, wherein the magnetic field above the target wafer is substantially parallel to an upper surface of the target wafer.

3. The apparatus of claim 2, wherein the magnetic field portion comprises a plurality of coils.

4. The apparatus of claim 3, wherein the plurality of coils are in a configuration comprising two or more concentric circles.

5. The apparatus of claim 3, wherein the plurality of coils comprise a spiral configuration.

6. The apparatus of claim 1, wherein the one or more current-carrying wires are independent and detached from each other.

7. The apparatus of claim 1, wherein the one or more current-carrying wires comprises one wire that is positioned in a series of parallel portions having a plurality of connecting portions.

8. A method for confining secondary electrons, the method comprising:
    generating plasma in a plasma chamber having a target wafer;
    positioning a magnetic field portion of a magnetic field configuration under the target wafer;
    biasing the target wafer to attract ions from the plasma towards the target wafer during a first time period and not during a second time period; and
    generating a magnetic field above the target wafer to confine secondary electrons on the target wafer during the first time period and not generating the magnetic field during the second time period.

9. The method of claim 8, wherein the magnetic field above the target wafer is substantially parallel to an upper surface of the target wafer.

10. The method of claim 9, wherein the magnetic field portion comprises a plurality of coils.

11. The method of claim 10, wherein the plurality of coils are in a configuration comprising two or more concentric circles.

12. The method of claim 11, wherein the plurality of coils comprise a spiral configuration.

13. The method of claim 9, wherein the magnetic field portion comprises one or more current-carrying wires.

14. The method of claim 13, wherein the one or more current-carrying wires are independent and detached from each other.

15. The method of claim 13, wherein the one or more current-carrying wires comprises one wire that is positioned in a series of parallel portions having a plurality of connecting portions.

16. The method of claim 9, wherein the magnetic field portion comprises a plurality of magnets.

17. The method of claim 16, wherein the plurality of magnets are positioned below the target wafer in a configuration so that the magnetic field does not substantially affect a portion of the plasma surrounding the target wafer.

18. An apparatus for confining secondary electrons, the apparatus comprising:
    a plasma chamber and a plasma source configured to generate plasma in the plasma chamber; and
    a magnetic field portion of a magnetic field configuration placed under a target wafer for generating a magnetic field above the target wafer for confining secondary electrons on the target wafer, wherein the target wafer and the magnetic field portion are disposed in the plasma chamber, and wherein the magnetic field portion comprises one or more current-carrying wires, and wherein the magnetic field is switched on during a first time period when the target wafer is biased to attract ions from the plasma and is switched off during a second time period when the target wafer is not biased to attract ions from the plasma.

* * * * *